(12) United States Patent
Lin et al.

(10) Patent No.: US 11,041,255 B2
(45) Date of Patent: Jun. 22, 2021

(54) SEMI-INSULATING SILICON CARBIDE CRYSTALLINE INGOT HAVING A RESISTIVITY LARGER THAN 10^7 OHM-CM AND MANUFACTURING METHOD THEREFOR

(71) Applicant: GlobalWafers Co., Ltd., Hsinchu (TW)

(72) Inventors: Ching-Shan Lin, Hsinchu (TW); Jian-Hsin Lu, Hsinchu (TW); Chien-Cheng Liou, Hsinchu (TW); I-Ching Li, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 32 days.

(21) Appl. No.: 16/450,930

(22) Filed: Jun. 24, 2019

(65) Prior Publication Data
US 2020/0190693 A1 Jun. 18, 2020

(30) Foreign Application Priority Data
Dec. 14, 2018 (TW) .................................. 107145264

(51) Int. Cl.
*C30B 25/20* (2006.01)
*C30B 29/36* (2006.01)
*C30B 25/16* (2006.01)

(52) U.S. Cl.
CPC .............. *C30B 29/36* (2013.01); *C30B 25/16* (2013.01); *C30B 25/205* (2013.01)

(58) Field of Classification Search
CPC ......... C30B 23/00; C30B 23/02; C30B 25/00; C30B 25/02; C30B 25/16; C30B 25/18; C30B 25/183; C30B 25/20; C30B 25/205; C30B 29/00; C30B 29/10; C30B 29/36; C23C 16/22; C23C 16/30; C23C 16/32; C23C 16/325; C23C 14/06; C23C 14/0635
USPC .... 117/84, 88–89, 90, 94–96, 101, 105–106, 117/937, 951
See application file for complete search history.

(56) References Cited

U.S. PATENT DOCUMENTS

2017/0342593 A1* 11/2017 Sato ..................... C01B 32/963

OTHER PUBLICATIONS

Zhang, et al. publication entitled "Nitrogen impurity incorporation behavior in a chimney HTCVD process: pressure and temperature dependence," Materials Science and Engineering B, vol. 61-62, pp. 151-154 (1999). (Year: 1999).*

(Continued)

*Primary Examiner* — Kenneth A Bratland, Jr.
(74) *Attorney, Agent, or Firm* — Li & Cai Intellectual Property Office

(57) ABSTRACT

A silicon carbide crystal and a manufacturing method thereof are provided. The silicon carbide crystal includes an N-type seed layer, a barrier layer, and a semi-insulating ingot, which are sequentially stacked and are made of silicon carbide. The N-type seed layer has a resistivity within a range of 0.01-0.03 Ω·cm. The barrier layer includes a plurality of epitaxial layers sequentially formed on the N-type seed layer by an epitaxial process. The C/Si ratios of the epitaxial layers gradually increase in a growth direction away from the N-type seed layer. A nitrogen concentration of the silicon carbide crystal gradually decreases from the N-type seed layer toward the semi-insulating ingot by a diffusion phenomenon, so that the semi-insulating crystal has a resistivity larger than $10^7$ Ω·cm.

8 Claims, 2 Drawing Sheets

(56) References Cited

OTHER PUBLICATIONS

Ferro, et al. publication entitled "A new model for in situ nitrogen incorporation into 4H-SiC during epitaxy," Sci. Rep., vol. 7, p. 43069 (2017). (Year: 2017).*

* cited by examiner

SEMI-INSULATING SILICON CARBIDE CRYSTALLINE INGOT HAVING A RESISTIVITY LARGER THAN 10^7 OHM-CM AND MANUFACTURING METHOD THEREFOR

CROSS-REFERENCE TO RELATED PATENT APPLICATION

This application claims the benefit of priority to Taiwan Patent Application No. 107145264, filed on Dec. 14, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an ingot and a manufacturing method thereof, and more particularly to a silicon carbide crystal and a manufacturing method thereof.

BACKGROUND OF THE DISCLOSURE

A conventional method for manufacturing a silicon carbide crystal is implemented by using a semi-insulating seed layer, so that a semi-insulating ingot can be formed from the semi-insulating seed layer in a growth process. However, the semi-insulating seed layer has an expensive price and is difficult to be obtained, which can have a consequential effect on a production efficiency and a manufacturing cost of the semi-insulating ingot. Accordingly, the above issues associated with the conventional method need to be improved.

SUMMARY OF THE DISCLOSURE

In response to the above-referenced technical inadequacies, the present disclosure provides a silicon carbide crystal and a manufacturing method thereof to effectively improve the issues associated with conventional methods.

In one aspect, the present disclosure provides a silicon carbide (SiC) crystal, which includes an N-type seed layer, a barrier layer, and a semi-insulating ingot. The N-type seed layer is made of a silicon carbide and has a resistivity within a range of 0.01-0.03 $\Omega \cdot cm$. The barrier layer has a plurality of epitaxial layers sequentially and epitaxially formed on the N-type seed layer. Each of the epitaxial layers is made of a silicon carbide and has a C/Si ratio, and the C/Si ratios of the epitaxial layers gradually increase in a forming direction away from the N-type seed layer. The semi-insulating ingot is made of a silicon carbide and is formed from one of the epitaxial layers that is arranged away from the N-type seed layer. A nitrogen concentration of the silicon carbide crystal gradually decreases from the N-type seed layer toward the semi-insulating ingot by a diffusion phenomenon, so that the semi-insulating ingot has a resistivity larger than $10^7$ $\Omega \cdot cm$.

In one aspect, the present disclosure provides a manufacturing method of a silicon carbide (SiC) crystal, which includes a preparation step implemented by providing an N-type seed layer that is made of a silicon carbide and has a resistivity within a range of 0.01-0.03 $\Omega \cdot cm$; an epitaxial step implemented by sequentially forming a plurality of epitaxial layers from the N-type seed layer by an epitaxial process, wherein each of the epitaxial layers is made of a silicon carbide, and C/Si ratios of the epitaxial layers gradually increase in a forming direction away from the N-type seed layer; and a growth step implemented by forming a semi-insulating ingot from one of the epitaxial layers arranged away from the N-type seed layer by a growth process, wherein the semi-insulating ingot is made of a silicon carbide, and a nitrogen concentration of the silicon carbide crystal gradually decreases from the N-type seed layer toward the semi-insulating ingot by a diffusion phenomenon, so that the semi-insulating ingot has a resistivity larger than $10^7$ $\Omega \cdot cm$.

Therefore, the epitaxial layers of the SiC crystal 100 of the present disclosure are formed between the N-type seed layer and the semi-insulating ingot for effectively avoiding the diffusion of the nitrogen of the N-type seed layer, so that the N-type seed layer, which is inexpensive and easily obtained, can be used to form the semi-insulating ingot having a high resistivity. Accordingly, the manufacturing cost of the semi-insulating ingot can be effectively decreased, and the producing efficiency of the semi-insulating ingot can be increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
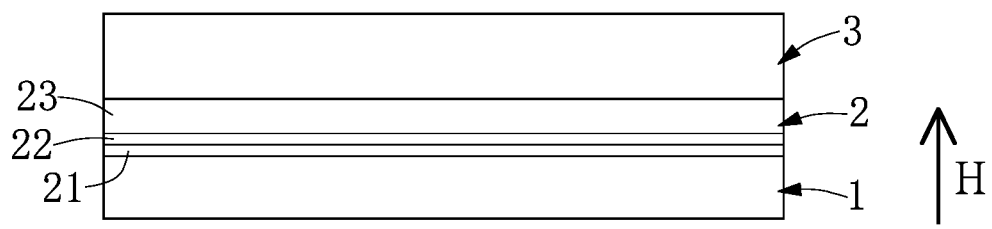
FIG. 1 is a planar view of a silicon carbide crystal according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
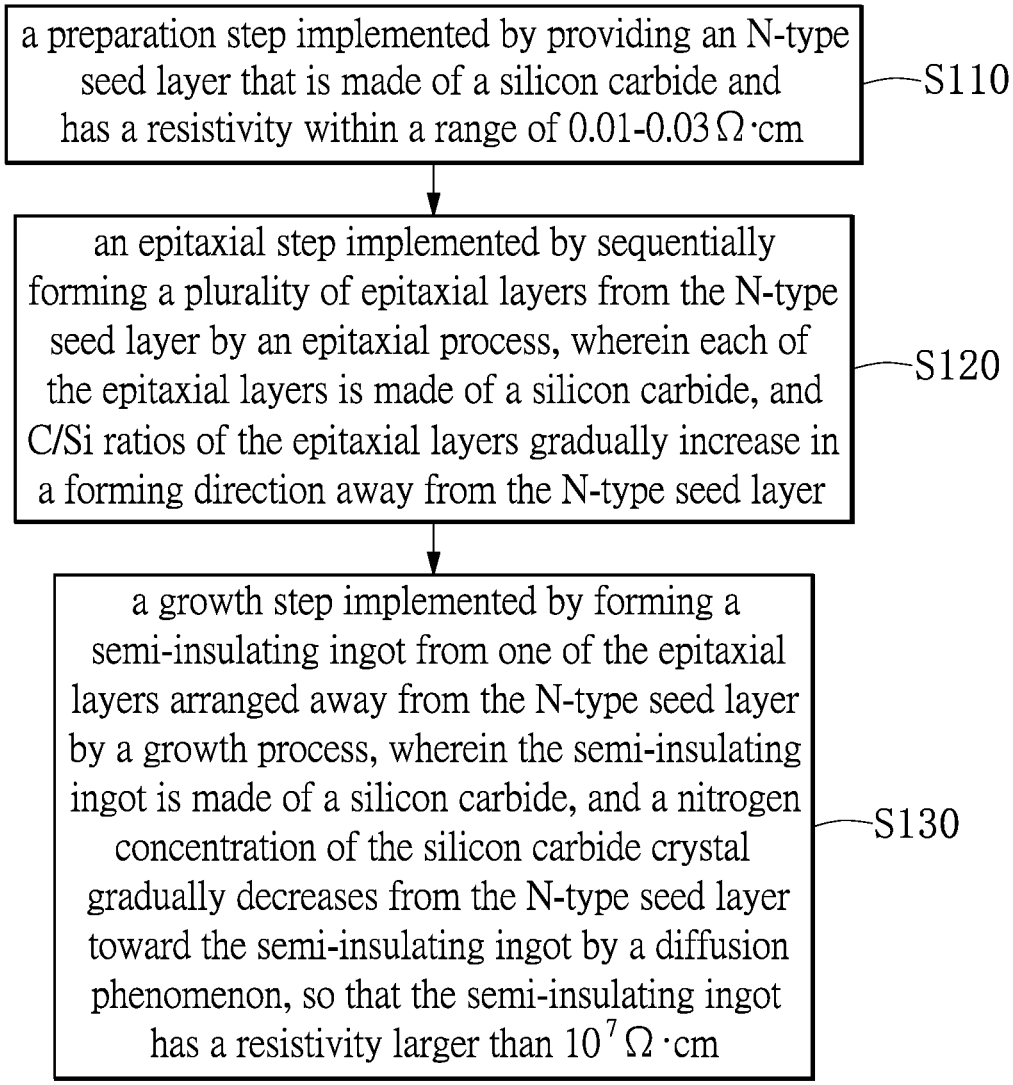
FIG. 2 is a flow chart of a manufacturing method of the silicon carbide crystal according to the present disclosure.

Referring to FIG. 1 and FIG. 2, an embodiment of the present disclosure provides a silicon carbide (SiC) crystal 100 and a manufacturing method thereof. The following description describes the structure of the SiC crystal 100, and then describes the manufacturing method.

As shown in FIG. 1, the SiC crystal 100 includes an N-type seed layer 1, a barrier layer 2, and a semi-insulating ingot 3. The N-type seed layer 1, the barrier layer 2, and the semi-insulating ingot 3 are sequentially formed and stacked in a forming direction H (e.g., a direction from a lower side toward an upper side shown in FIG. 1), and are made of silicon carbide. The following description describes each part of the SiC crystal 100 of the present embodiment, but the present disclosure is not limited thereto.

The N-type seed layer 1 has a thickness within a range of 300-500 μm, and the thickness of the N-type seed layer 1 shown in FIG. 1 is 350 μm. The N-type seed layer 1 has a resistivity within a range of 0.01-0.03 Ω·cm, and has a nitrogen concentration being $M1 \cdot 10^{18}$ atom/cm$^3$, in which 0<M1<10. Specifically, the resistivity of the N-type seed layer 1 in the present embodiment can be 0.02 Ω·cm, and M1 can be 5.71, but the present disclosure is not limited thereto.

Accordingly, the thickness of the N-type seed layer 1 in the present embodiment is thinner than that of the conventional semi-insulating seed layer (e.g., is approximately a half of the thickness of the conventional semi-insulating seed layer), the price of the N-type seed layer 1 of the present embodiment is cheaper than that of the conventional semi-insulating seed layer (e.g., is approximately lower than 60% of the price of the conventional semi-insulating seed layer), and the N-type seed layer 1 of the present embodiment can be more easily obtained than the conventional semi-insulating seed layer.

However, due to the higher nitrogen concentration of the N-type seed layer 1, the SiC crystal 100 of the present embodiment is formed with the barrier layer 2 to prevent the nitrogen of the N-type seed layer 1 from diffusing into the semi-insulating ingot 3. In other words, the barrier layer 2 is configured to avoid the diffusion of the nitrogen of the N-type seed layer 1, so that the semi-insulating ingot 3 can be formed with a low nitrogen concentration and a high resistivity.

The barrier layer 2 includes a plurality of epitaxial layers 21, 22, 23 sequentially and epitaxially formed on the N-type seed layer 1, and each of the epitaxial layers 21, 22, 23 is made of a silicon carbide. A thickness of the barrier layer 2 is less than or equal to 300 μm, and a thickness of each of the epitaxial layers 21, 22, 23 is less than or equal to 100 μm. Specifically, one of the epitaxial layers 21, 22, 23 (i.e., the epitaxial layer 23) connected to the semi-insulating ingot 3 has a first thickness, and another one of the epitaxial layers 21, 22, 23 (i.e., the epitaxial layer 21) connected to the N-type seed layer 1 has a second thickness that is less than the first thickness.

Moreover, the number of the epitaxial layers 21, 22, 23 of the barrier layer 2 in the present embodiment is three, and the thicknesses of the epitaxial layers 21, 22, 23 distributed in the forming direction H are sequentially 5 μm, 5 μm, and 30 μm, but the present disclosure is not limited thereto.

In addition, each of the epitaxial layers 21, 22, 23 has a C/Si ratio (i.e., a ratio of carbon to silicon), and the C/Si ratios of the epitaxial layers 21, 22, 23 gradually increase in the forming direction H that is away from the N-type seed layer 1. For example, the C/Si ratios of the epitaxial layers 21, 22, 23 distributed in the forming direction H can be sequentially 1.2-1.4, 1.4-1.6, and 1.7-1.9. Specifically, in the present embodiment, the C/Si ratios of the epitaxial layers 21, 22, 23 distributed in the forming direction H are sequentially 1.3, 1.5, and 1.8, but the present disclosure is not limited thereto.

Accordingly, the epitaxial layers 21, 22, 23 of the barrier layer 2 can be formed with different C/Si ratios and different thicknesses, thereby effectively avoiding the diffusion of the nitrogen of the N-type seed layer 1. Moreover, in the present embodiment, the nitrogen concentrations of the three epitaxial layers 21, 22, 23 distributed in the forming direction are sequentially $M2 \cdot 10^{17}$ atom/cm$^3$, $M3 \cdot 10^{16}$ atom/cm$^3$, and $M4 \cdot 10^{15}$ atom/cm$^3$, in which 0<M1<10, 0<M2<10, 0<M3<10, and 0<M4<10. Specifically, M2 can be 5.5, M3 can be 5.5, and M4 can be 4.0, but the present disclosure is not limited thereto.

It should be noted that the barrier layer 2 of the present embodiment is not only configured to avoid the diffusion of the nitrogen of the N-type seed layer 1, but also can be configured to modify the defects existing in the N-type seed layer 1. For example, when the conventional semi-insulating seed layer is used to form a semi-insulating ingot, a basal plane dislocation (BPD) state existing in the conventional semi-insulating seed layer will entirely extend into the semi-insulating ingot. However, in the present embodiment, a BPD state existing in the N-type seed layer 1 will be gradually improved when the epitaxial layers 21, 22, 23 of the barrier layer 2 are formed in an epitaxial process, so that the semi-insulating ingot 3 formed on the barrier layer 2 has a BPD state superior to that of the N-type seed layer 1.

The semi-insulating ingot 3 is formed from one of the epitaxial layers 21, 22, 23 that is arranged away from the N-type seed layer 1, and is made of a silicon carbide. Since the barrier layer 2 is disposed between the semi-insulating ingot 3 and the N-type seed layer 1, a nitrogen concentration of the SiC crystal 100 can gradually decrease from the N-type seed layer 1 toward the semi-insulating ingot 3 by a diffusion phenomenon, causing the semi-insulating ingot 3 to have a resistivity larger than $10^7$ Ω·cm.

In the present embodiment, a nitrogen concentration of the semi-insulating ingot 3 is close to that of the epitaxial layer 23, and the resistivity of the semi-insulating ingot 3 is $M \cdot 10^9$ Ω·cm, in which 0<M<10. Specifically, the resistivity of the semi-insulating ingot 3 gradually and substantially increases in the forming direction H. For example, if the semi-insulating ingot 3 is divided into ten portions in the forming direction H, the resistivity of the ten portions of the semi-insulating ingot 3 distributed in the forming direction H can be 2.8, 3.5, 5.4, 6.5, 6.7, 6.7, 6.6, 6.6, 6.7, and 7.0, but the present disclosure is not limited thereto.

In summary, the epitaxial layers 21, 22, 23 of the SiC crystal 100 of the present embodiment are formed between the N-type seed layer 1 and the semi-insulating ingot 3 for effectively avoiding the diffusion of the nitrogen of the N-type seed layer 1 (e.g., the nitrogen concentration of the semi-insulating ingot 3 is a thousandth of the nitrogen concentration of the N-type seed layer 1), so that the N-type seed layer 1, which is inexpensive and easily obtained, can be used to form the semi-insulating ingot 3 having a high resistivity. Accordingly, the manufacturing cost of the semi-insulating ingot 3 can be effectively decreased, and the producing efficiency of the semi-insulating ingot 3 can be increased.

The above description describes the structure of the SiC crystal 100 of the present embodiment, and the following description describes the manufacturing method of the present embodiment. Moreover, the SiC crystal 100 of the present embodiment is preferably produced by implementing the following manufacturing method, but the present disclosure is not limited thereto. In other words, the SiC crystal 100 can be produced by implementing the following manufacturing method that can be adjusted or changed according to design requirements.

As shown in FIG. 1 and FIG. 2, the manufacturing method of the present embodiment includes a preparation step S110, an epitaxial step S130, and a growth step S150. The following description describes each step of the manufacturing method of the present embodiment, and the structure or material of each part of the SiC crystal 100 will be omitted for the sake of brevity.

The preparation step S110 is implemented by providing a N-type seed layer 1 that is made of a silicon carbide and has a resistivity within a range of 0.01-0.03 Ω·cm.

The epitaxial step S130 is implemented by sequentially forming a plurality of epitaxial layers 21, 22, 23 (e.g., three epitaxial layers 21, 22, 23) from the N-type seed layer 1 by an epitaxial process. Each of the epitaxial layers 21, 22, 23 is made of a silicon carbide, and C/Si ratios of the epitaxial layers 21, 22, 23 gradually increase in a forming direction H away from the N-type seed layer 1.

Specifically, the forming of the epitaxial layers 21, 22, 23 in the epitaxial step S130 is preferably implemented under a no-nitrogen environment. Moreover, one of the epitaxial layers 21, 22, 23 (e.g., the epitaxial layer 23) connected to the semi-insulating ingot 3 is formed under a first temperature and a first pressure and has a first thickness, and another one of the epitaxial layers 21, 22, 23 (e.g., the epitaxial layer 21) connected to the N-type seed layer 1 is formed under a second temperature and a second pressure and has a second thickness, in which the second temperature, the second pressure, and the second thickness are respectively less than the first temperature, the first pressure, and the first thickness. In other words, the epitaxial layer 23 formed later is formed under a higher temperature and a higher pressure and has a larger thickness, and the epitaxial layer 21 formed earlier is formed under a lower temperature and a lower pressure and has a smaller thickness.

The growth step S150 is implemented by forming a semi-insulating ingot 3 from one of the epitaxial layers 21, 22, 23 arranged away from the N-type seed layer 1 by a growth process. Specifically, the semi-insulating ingot 3 is made of a silicon carbide, and a nitrogen concentration of the silicon carbide crystal 100 gradually decreases from the N-type seed layer 1 toward the semi-insulating ingot 3 by a diffusion phenomenon, so that the semi-insulating ingot 3 has a resistivity larger than $10^7$ Ω·cm.

In conclusion, the epitaxial layers 21, 22, 23 of the SiC crystal 100 of the present disclosure are formed between the N-type seed layer 1 and the semi-insulating ingot 3 for effectively avoiding the diffusion of the nitrogen of the N-type seed layer 1 (e.g., the nitrogen concentration of the semi-insulating ingot 3 is one thousandth of the nitrogen concentration of the N-type seed layer 1), so that the N-type seed layer 1, which is inexpensive and easily obtained, can be used to form the semi-insulating ingot 3 having a high resistivity. Accordingly, the manufacturing cost of the semi-insulating ingot 3 can be effectively decreased, and the producing efficiency of the semi-insulating ingot 3 can be increased.

Moreover, the barrier layer 2 of the present disclosure is not only configured to avoid the diffusion of the nitrogen of the N-type seed layer 1, but also can be configured to modify the defects existing in the N-type seed layer 1. For example, in the present disclosure, a BPD state existing in the N-type seed layer 1 will be gradually improved when the epitaxial layers 21, 22, 23 of the barrier layer 2 are formed in an epitaxial process, so that the semi-insulating ingot 3 formed on the barrier layer 2 has a BPD state superior to that of the N-type seed layer 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A silicon carbide (SiC) crystal, comprising:
   an N-type seed layer made of a silicon carbide and having a resistivity within a range of 0.01-0.03 Ω·cm;
   a barrier layer having a plurality of epitaxial layers sequentially and epitaxially formed on the N-type seed layer, wherein each of the epitaxial layers is made of a silicon carbide and has a C/Si ratio, and the C/Si ratios of the epitaxial layers gradually increase in a forming direction away from the N-type seed layer; and
   a semi-insulating ingot made of a silicon carbide and formed from one of the epitaxial layers that is arranged away from the N-type seed layer, wherein a nitrogen concentration of the silicon carbide crystal gradually decreases from the N-type seed layer toward the semi-insulating ingot by a diffusion phenomenon, so that the semi-insulating ingot has a resistivity larger than $10^7$ Ω·cm,
   wherein the number of the epitaxial layers of the barrier layer is three, and the C/Si ratios of the epitaxial layers distributed in the forming direction are sequentially 1.2-1.4, 1.4-1.6, and 1.7-1.9.

2. The SiC crystal according to claim 1, wherein the resistivity of the semi-insulating ingot is $M \cdot 10^9$ Ω·cm, 0<M<10, and the resistivity of the semi-insulating ingot gradually and substantially increases in the forming direction.

3. The SiC crystal according to claim 1, wherein the N-type seed layer has a thickness within a range of 300-500 μm, and the barrier layer has a thickness less than or equal to 300 μm.

4. The SiC crystal according to claim 1, wherein a thickness of each of the epitaxial layers is less than or equal to 100 μm, one of the epitaxial layers connected to the semi-insulating ingot has a first thickness, and another one of the epitaxial layers connected to the N-type seed layer has a second thickness less than the first thickness.

5. The SiC crystal according to claim 1, wherein a nitrogen concentration of the N-type seed layer is $M1 \cdot 10^{18}$ atom/cm$^3$, the number of the epitaxial layers of the barrier layer is three, and nitrogen concentrations of the three epitaxial layers distributed in the forming direction are sequentially $M2 \cdot 10^{17}$ atom/cm$^3$, $M3 \cdot 10^{16}$ atom/cm$^3$, and $M4 \cdot 10^{15}$ atom/cm$^3$, and wherein 0<M1<10, 0<M2<10, 0<M3<10, and 0<M4<10.

6. A manufacturing method of a silicon carbide (SiC) crystal, comprising:
 a preparation step implemented by providing an N-type seed layer that is made of a silicon carbide and has a resistivity within a range of 0.01-0.03 Ω·cm;
 an epitaxial step implemented by sequentially forming a plurality of epitaxial layers from the N-type seed layer by an epitaxial process, wherein each of the epitaxial layers is made of a silicon carbide, and C/Si ratios of the epitaxial layers gradually increase in a forming direction away from the N-type seed layer; and
 a growth step implemented by forming a semi-insulating ingot from one of the epitaxial layers arranged away from the N-type seed layer by a growth process, wherein the semi-insulating ingot is made of a silicon carbide, and a nitrogen concentration of the silicon carbide crystal gradually decreases from the N-type seed layer toward the semi-insulating ingot by a diffusion phenomenon, so that the semi-insulating ingot has a resistivity larger than $10^7$ Ω·cm,
 wherein in the epitaxial step, the number of the epitaxial layers of the barrier layer is three, and the C/Si ratios of the epitaxial layers distributed in the forming direction are sequentially 1.2-1.4, 1.4-1.6, and 1.7-1.9.

7. The manufacturing method according to claim 6, wherein in the epitaxial step, the forming of the epitaxial layers is implemented under a no-nitrogen environment.

8. The manufacturing method according to claim 6, wherein in the epitaxial step, one of the epitaxial layers connected to the semi-insulating ingot is formed under a first temperature and a first pressure and has a first thickness, and another one of the epitaxial layers connected to the N-type seed layer is formed under a second temperature and a second pressure and has a second thickness, and wherein the second temperature, the second pressure, and the second thickness are respectively less than the first temperature, the first pressure, and the first thickness.

* * * * *